(12) United States Patent
Inui

(10) Patent No.: US 9,226,382 B2
(45) Date of Patent: Dec. 29, 2015

(54) PRINTED WIRING BOARD

(71) Applicant: IBIDEN CO., LTD., Ogaki (JP)

(72) Inventor: Tsuyoshi Inui, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/279,549

(22) Filed: May 16, 2014

(65) Prior Publication Data

US 2014/0247561 A1 Sep. 4, 2014

Related U.S. Application Data

(63) Continuation of application No. 13/408,208, filed on Feb. 29, 2012, now Pat. No. 8,745,860.

(60) Provisional application No. 61/451,764, filed on Mar. 11, 2011.

(51) Int. Cl.
| | |
|---|---|
| *H05K 1/16* | (2006.01) |
| *H05K 1/02* | (2006.01) |
| *H05K 1/18* | (2006.01) |
| *H01L 23/00* | (2006.01) |
| *H05K 3/46* | (2006.01) |

(52) U.S. Cl.
CPC ............. *H05K 1/0206* (2013.01); *H01L 24/24* (2013.01); *H05K 1/186* (2013.01); *H05K 3/4697* (2013.01); *H01L 2224/12105* (2013.01); *H01L 2224/32225* (2013.01); *H01L 2224/73267* (2013.01); *H01L 2224/92244* (2013.01); *H01L 2225/1035* (2013.01); *H01L 2924/01029* (2013.01); *H01L 2924/15153* (2013.01); *H01L 2924/15311* (2013.01); *H05K 3/4679* (2013.01); *H05K 2201/09563* (2013.01); *Y10T 29/4913* (2015.01); *Y10T 29/4916* (2015.01); *Y10T 29/49117* (2015.01); *Y10T 29/49124* (2015.01); *Y10T 29/49126* (2015.01); *Y10T 29/49144* (2015.01); *Y10T 29/49171* (2015.01)

(58) Field of Classification Search
CPC ............... H05K 1/182–1/185; H05K 1/00206; H05K 1/113; H05K 1/186; H05K 3/4697; H05K 24/24

See application file for complete search history.

(56) References Cited

U.S. PATENT DOCUMENTS

| 4,922,324 A | * | 5/1990 | Sudo | 257/700 |
|---|---|---|---|---|
| 5,923,084 A | * | 7/1999 | Inoue et al. | 257/712 |
| 6,753,600 B1 | * | 6/2004 | Ho | 257/698 |

(Continued)

FOREIGN PATENT DOCUMENTS

JP 2006-222164 8/2006

*Primary Examiner* — Steven T Sawyer
(74) *Attorney, Agent, or Firm* — Oblon, McClelland, Maier & Neustadt, L.L.P.

(57) ABSTRACT

A printed wiring board includes a first resin insulation layer, a second resin insulation layer formed on the first insulation layer and having an opening portion, a mounting conductive layer formed on the first resin insulation layer in the opening portion of the second resin insulation layer such that the mounting conductive layer has a surface exposed by the opening portion, an electronic component positioned in the opening portion of the second resin insulation layer such that the electronic component is mounted on the surface of the mounting conductive layer, and a heat-dissipating via conductor formed in the first resin insulation layer such that the heat-dissipating via conductor is connected to the mounting conductive layer formed on the first resin insulation layer.

20 Claims, 14 Drawing Sheets

(56) References Cited

U.S. PATENT DOCUMENTS

| | | | |
|---|---|---|---|
| 7,116,557 B1* | 10/2006 | Raby et al. | 361/720 |
| 7,285,728 B2 | 10/2007 | Sunohara et al. | |
| 8,196,296 B2 | 6/2012 | Yukiiri et al. | |
| 2005/0048759 A1* | 3/2005 | Hsu | 438/618 |
| 2006/0007662 A1* | 1/2006 | Vasudivan | H05K 1/0231 361/763 |
| 2006/0145328 A1* | 7/2006 | Hsu | H01L 23/5389 257/690 |
| 2006/0219432 A1* | 10/2006 | Usui et al. | 174/262 |
| 2006/0237225 A1* | 10/2006 | Kariya et al. | 174/260 |
| 2009/0288805 A1* | 11/2009 | Lopez | 165/80.2 |
| 2009/0293271 A1 | 12/2009 | Tanaka | |

\* cited by examiner (A)

(B)

(C)

(A)

(B)

(C)

(D)

(A)

(B)

(C)

PRINTED WIRING BOARD

CROSS-REFERENCE TO RELATED APPLICATIONS

The present application is a continuation of and claims the benefit of priority to U.S. application Ser. No. 13/408,208, filed Feb. 29, 2012, which is based on and claims the benefit of priority to U.S. Application No. 61/451,764, filed Mar. 11, 2011. The entire contents of these applications are incorporated herein by reference.

BACKGROUND OF THE INVENTION

1. Field of the Invention

The present invention relates to a method for manufacturing a printed wiring board which does not contain a core substrate and into which an electronic component is built.

2. Discussion of the Background

Japanese Laid-Open Patent Publication No. 2006-222164 describes embedding a semiconductor element in an insulation layer to obtain a thinner device without using a core substrate. Japanese Laid-Open Patent Publication No. 2006-222164 describes a method for manufacturing a semiconductor device including mounting a semiconductor element on a support board, forming a buildup layer on the support board and the semiconductor element, and detaching the support board from the buildup layer. In Japanese Laid-Open Patent Publication No. 2006-222164, a manufacturing method including the following process is described (see FIGS. 19 and 20 of Japanese Laid-Open Patent Publication No. 2006-222164). A semiconductor element is covered with an insulation layer. Then, the insulation layer is polished until electrodes of the semiconductor element are exposed, and openings reaching pads on the support board are formed in the insulation layer. Then, via conductors are formed by filling the openings with plating. The contents of this publication are incorporated herein by reference in their entirety.

SUMMARY OF THE INVENTION

According to one aspect of the present invention, a method for manufacturing a printed wiring board includes forming on a support board a first resin insulation layer having a first surface and a second surface on the opposite side of the first surface of the first resin insulation layer such that the second surface of the first resin insulation layer faces the support board, forming on the first surface of the first resin insulation layer a second resin insulation layer having a first surface and a second surface on the opposite side of the first surface of the second resin insulation layer such that the second surface of the second resin insulation layer faces the first surface of the first resin insulation layer, forming in the second resin insulation layer an opening portion in which an electronic component having an electrode is mounted, accommodating the electronic component in the opening portion of the second resin insulation layer such that the electrode of the electronic component faces the first surface of the second resin insulation layer, forming on the first surface of the second resin insulation layer and the electronic component an interlayer resin insulation layer, and forming in the interlayer resin insulation layer a via conductor reaching to the electrode of the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
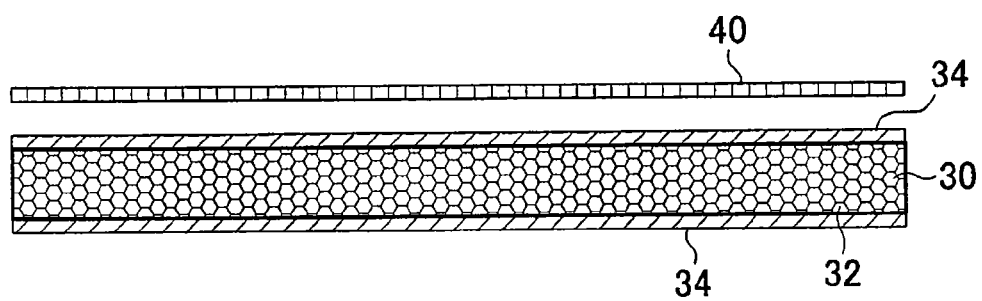
FIGS. 1(A)-1(C) are views of steps for manufacturing a printed wiring board according to the first embodiment of the present invention.
Figure 1:
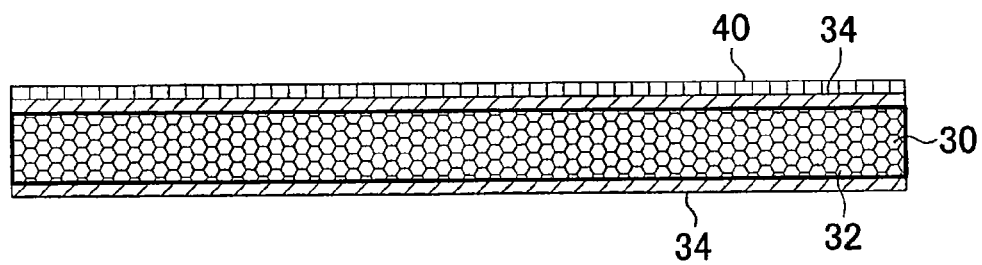
Figure 1:
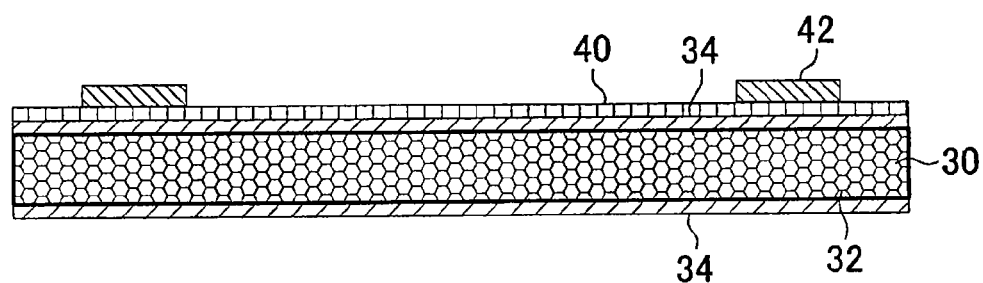
Figure 2:
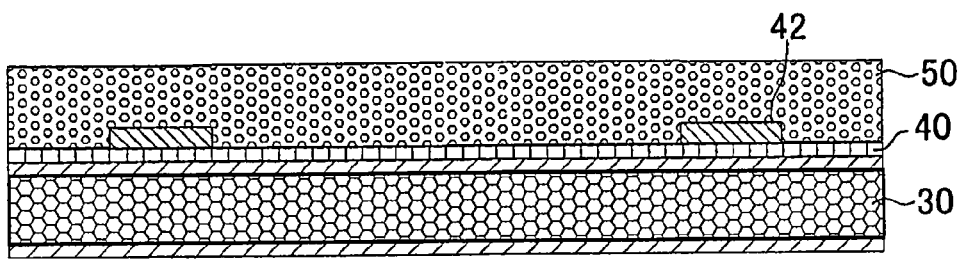
FIGS. 2(A)-2(D) are views of steps for manufacturing a printed wiring board according to the first embodiment.
Figure 2:
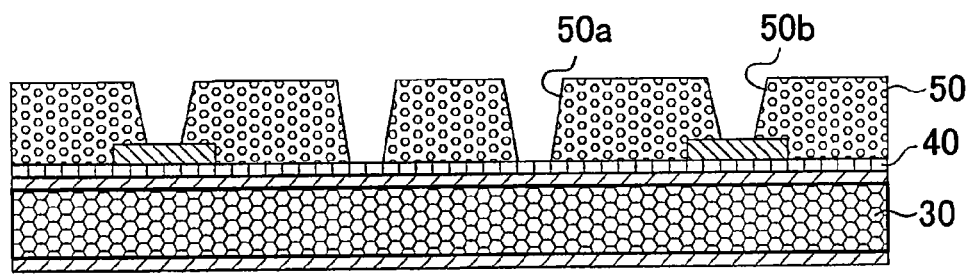
Figure 2:
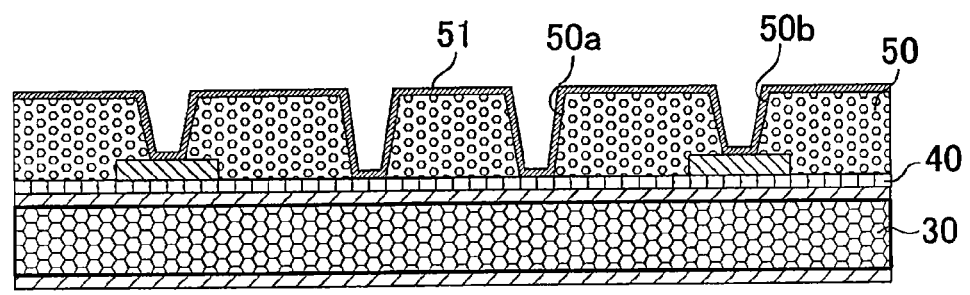
Figure 2:
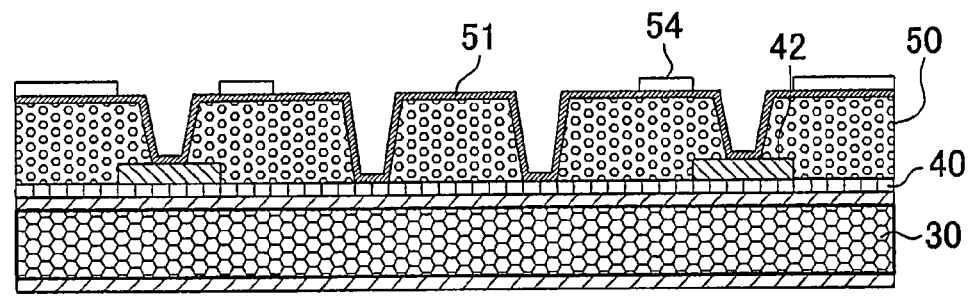

The embodiments will now be described with reference to the accompanying drawings, wherein like reference numerals designate corresponding or identical elements throughout the various drawings.

First Embodiment

Figure 7:
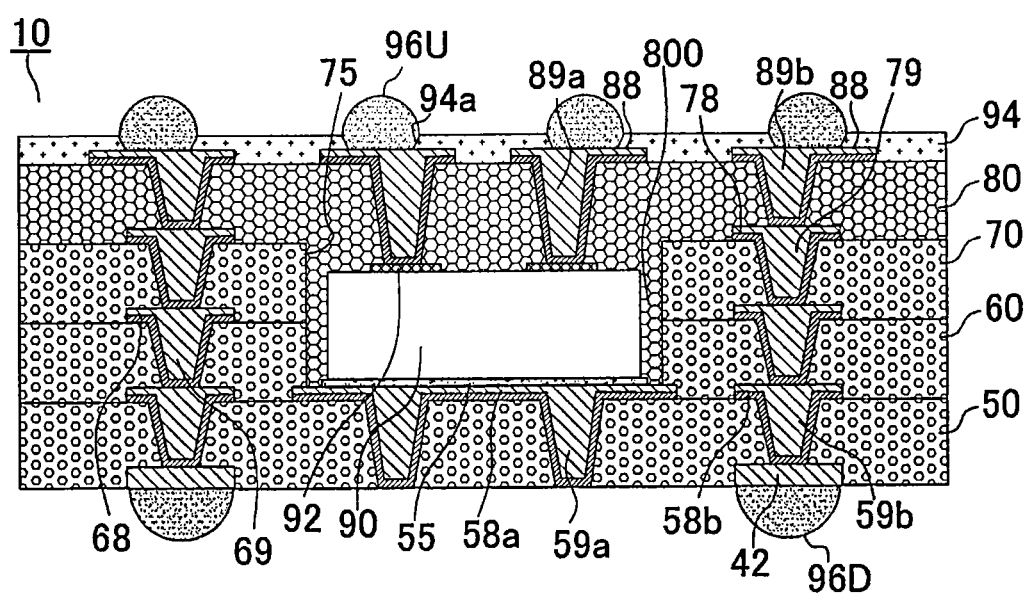
FIG. 7 is a cross-sectional view of a printed wiring board according to the first embodiment of the present invention.
Figure 8:
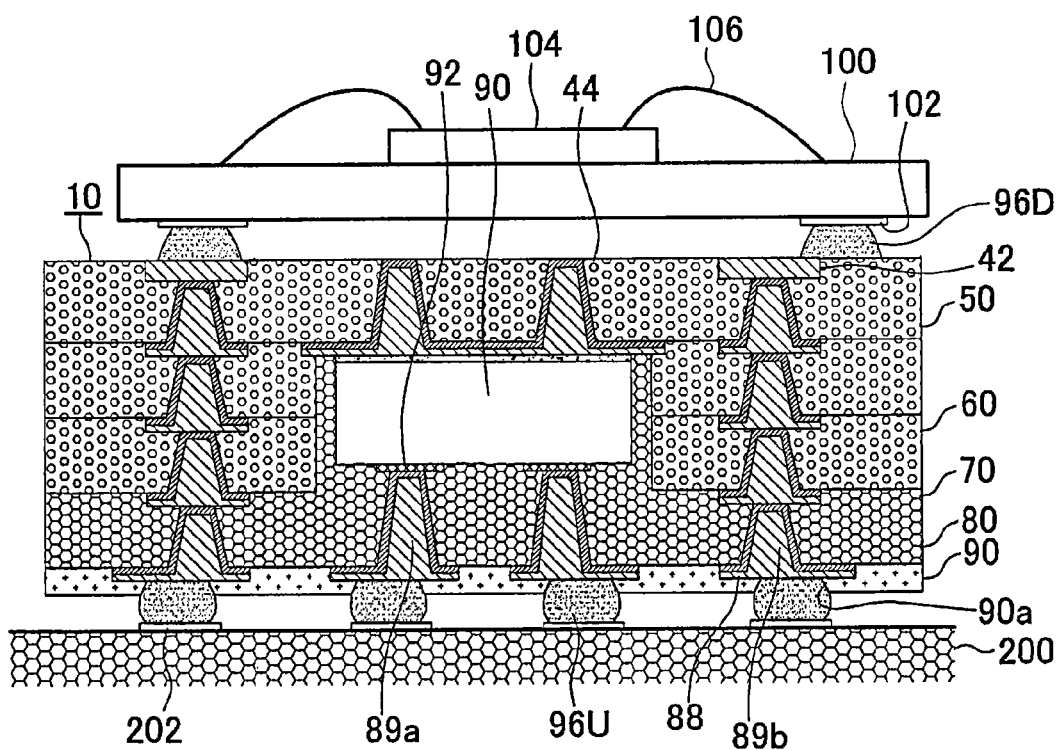
FIG. 8 is a view showing an applied example of the printed wiring board shown in FIG. 7.

The following describes a printed wiring board according to the first embodiment of the present invention by referring to FIGS. 7 and 8. FIG. 7 is a cross-sectional view of printed wiring board 10 according to the first embodiment. FIG. 8 shows how a printed wiring board of the first embodiment is used. In FIG. 8, the printed wiring board shown in FIG. 7 is mounted on motherboard 200, and another PKG substrate 100 is further mounted on the printed wiring board of the first embodiment.

As shown in FIG. 7, printed wiring board 10 includes first resin insulation layer 50, first conductive layer (58b) on the first resin insulation layer, second resin insulation layer 60 on the first resin insulation layer and the first conductive layer, second conductive layer 68 on the second resin insulation layer, third resin insulation layer 70 on the second resin insulation layer and the second conductive layer, third conductive layer 78 on the third resin insulation layer, interlayer resin insulation layer 80 on the third resin insulation layer and the third conductive layer, conductive layer 88 on the interlayer resin insulation layer, and solder-resist layer 94 on the interlayer resin insulation layer and the conductive layer. Electrode 42 is embedded in the second-surface side of first resin insulation layer 50. The second surface of the electrode is exposed from the first resin insulation layer, and solder bump (96D) is formed on the second surface of electrode 42. Opening 75 for accommodating an electronic component is formed in the central portion of second insulation layer 60 and third resin insulation layer 70. Electronic component 90 such as an IC chip is accommodated in opening 75. Filler resin 800 is filled between the inner walls of the second and third resin insulation layers and IC chip 90. Each conductive layer includes multiple conductive circuits.

Electrode 42 and first conductive layer (58*b*) are connected by first via conductor (59*b*) which penetrates through first resin insulation layer 50. Mounting conductive layer (58*a*) is formed on the first resin insulation layer under IC chip 90. Heat-dissipating via conductor (59*a*) penetrating through first resin insulation layer 50 is connected to the mounting conductive layer. First conductive layer (58*b*) and second conductive layer 68 are connected by second via conductor 69 penetrating through second resin insulation layer 60. Second conductive layer 68 and third conductive layer 78 are connected by third via conductor 79 penetrating through third resin insulation layer 70. Conductive layer 88 and third conductive layer 78 are connected by via conductor (89*b*) penetrating through interlayer resin insulation layer 80. Electrode 92 of IC chip 90 and conductive layer 88 are connected by connection via conductor (89*a*).

Adhesive layer (die attachment) 55 made of silver paste is formed on mounting conductive layer (58*a*). The solder-resist layer has opening (94*a*) that exposes the conductive layer, a via conductor or a connection via conductor. Solder bump (96U) is formed in opening (94*a*).

In FIG. 8, the printed wiring board in FIG. 7 is inverted. Pad 102 of package substrate 100 is connected to printed wiring board 10 by solder bump (96D) of printed wiring board 10. Memory 104 is mounted on package substrate 100, and package substrate 100 and the memory are connected by wire 106. Meanwhile, pad 202 of motherboard 200 is connected to printed wiring board 10 by solder bump (96U) of printed wiring board 10.

The following describes a method for manufacturing a printed wiring board according to the first embodiment by referring to FIGS. 1~8. Copper-clad laminate 30 and 3~20 μm-thick copper foil 40 are prepared (FIG. 1(A)).

Copper foil 40 is bonded to copper-clad laminate 30 using an adhesive agent or through ultrasonic bonding (FIG. 1(B)). The periphery of the copper-clad laminate and the periphery of the copper foil are bonded at a predetermined width. A plating resist with a predetermined pattern is formed on the copper foil, and by performing electrolytic copper plating, electrode 42 is formed on a portion without the plating resist. The thickness of the electrode is 10 μm~40 m. The plating resist is removed (FIG. 1(C)). The electrode has a first surface and a second surface opposite the first surface. The second surface of the electrode is the surface facing copper foil 40.

An insulation layer is laminated on copper foil 40 and the first surface of the electrode. Then, first resin insulation layer 50 is formed on copper foil 40 and the electrodes by thermal pressing (FIG. 2(A)). The first resin insulation layer has a first surface and a second surface opposite the first surface. The second surface is the surface facing copper foil 40. Side walls and the first surface of the electrode are covered by the first resin insulation layer. The first resin insulation layer is formed with resin such as epoxy and with inorganic particles such as glass. The first resin insulation layer is preferred to further include reinforcing material such as glass cloth. One or more resin layers and wiring layers are alternately formed between the support board and the first resin insulation layer. Each wiring layer includes multiple conductive circuits, which are connected by via conductors penetrating through their respective resin layers. Opening (50*b*) reaching electrode 42 and opening (50*a*) reaching copper foil 40 are formed in first resin insulation layer 50 using a laser. The first surface of the first resin insulation layer and the inner walls of openings (50*a*, 50*b*) are roughened (FIG. 2(B)). Roughened surfaces formed on the first surface of the first resin insulation layer and the inner walls of openings (50*a*, 50*b*) are not shown in the drawings. Opening (50*b*) exposes the first surface of an electrode. Electroless plated film 51 is formed on the surface of first resin insulation layer 50 and the inner surfaces of openings (50*a*, 50*b*) by performing electroless plating (FIG. 2(C)).

Plating resist 54 with a predetermined pattern is formed on electroless plated film 51 (FIG. 2(D)). By performing electrolytic plating, openings (50*a*, 50*b*) are filled with electrolytic plated film. At the same time, electrolytic plated film 56 is formed on portions of the first surface of the first resin insulation layer where the plating resist is not formed (FIG. 3(A)). Plating resist 54 is removed. Then, electroless plated film 51 between portions of electrolytic plated film is removed. First conductive layer (58*b*) including multiple conductive circuits, mounting conductive layer (58*a*), first via conductor (59*b*) and heat-dissipating via conductor (59*a*) are completed (FIG. 3(B)). The external shape of the mounting conductive layer is larger than the external shape of an electronic component to be mounted. Surfaces of the first conductive layer, mounting conductive layer and the first via conductor are roughened. The roughened surfaces of the first conductive layer, mounting conductive layer and first via conductor are not shown in the drawings. The first via conductor connects the first conductive layer and the electrode. The heat-dissipating via conductor connects the mounting conductive layer and copper foil. Removable layer 57 is formed on mounting conductive layer (58*a*) (FIG. 3(C)). The first conductive layer includes a bench mark, and a removable layer is formed on the mounting conductive layer based on the bench mark. Also, since the bench mark and the mounting conductive layer are formed simultaneously, the bench mark and the mounting conductive layer are related. The removable layer is formed so that a resin insulation layer to be formed on the mounting conductive layer can be removed from the mounting conductive layer. The removable layer prevents the mounting conductive layer and the resin insulation layer on the mounting conductive layer from being adhered. The removable layer is not adhered at least to the mounting conductive layer. As an example of the removable layer, metal foil, resin film without adhesiveness, resin film with weak adhesiveness, paper and the like are listed. If a mounting conductive layer is not adhered to a resin insulation layer on the mounting conductive layer, a removable layer is not required to be formed on the mounting conductive layer. For example, if the surface of a mounting conductive layer is flat, since adhesion is weak between the resin insulation layer and the mounting conductive layer, the resin insulation layer is laminated directly on the mounting conductive layer. When the first conductive layer is roughened, the surface of the mounting conductive layer is not roughened by covering the mounting conductive layer with protective film. The surface of the mounting conductive layer is flat and the surface of the first conductive layer is roughened.

Figure 3:
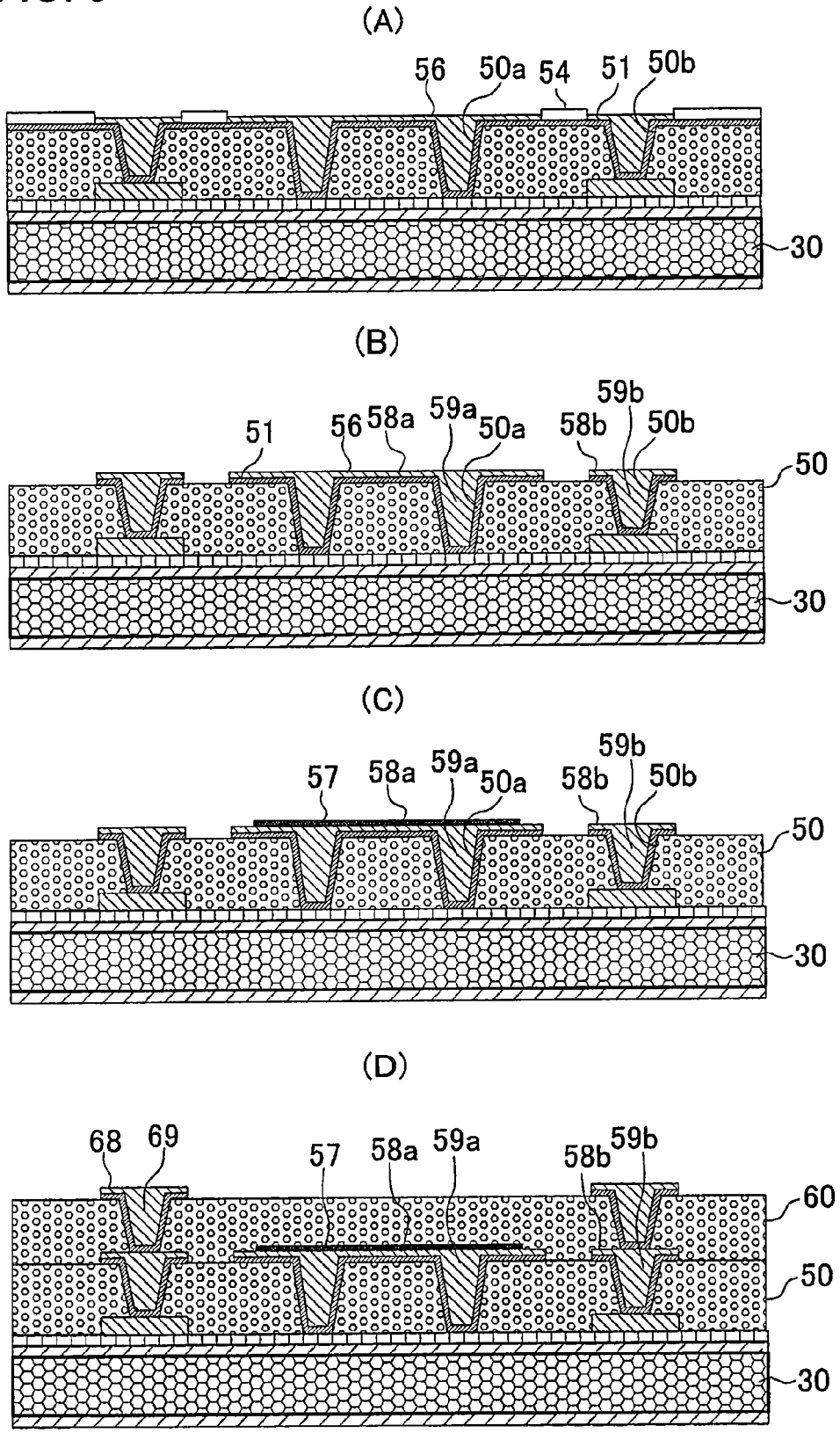
FIGS. 3(A)-3(D) are views of steps for manufacturing a printed wiring board according to the first embodiment.
Figure 4:
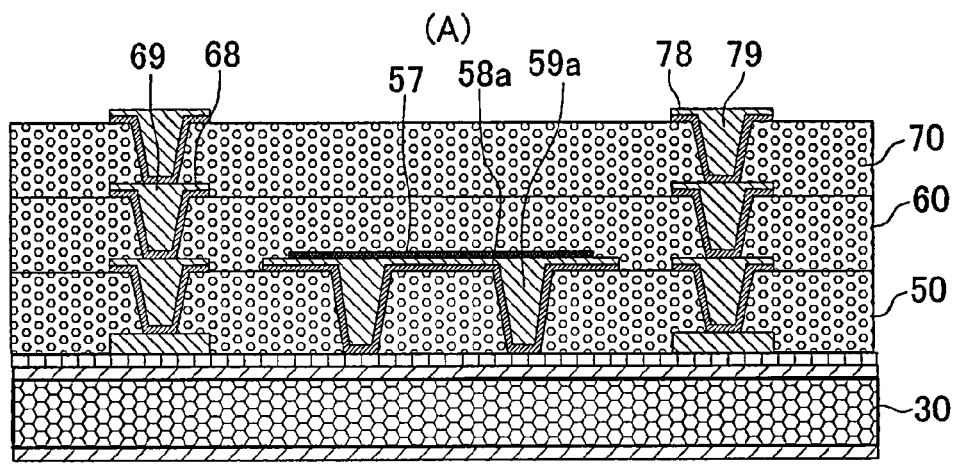
FIGS. 4(A)-4(C) are views of steps for manufacturing a printed wiring board according to the first embodiment.
Figure 4:
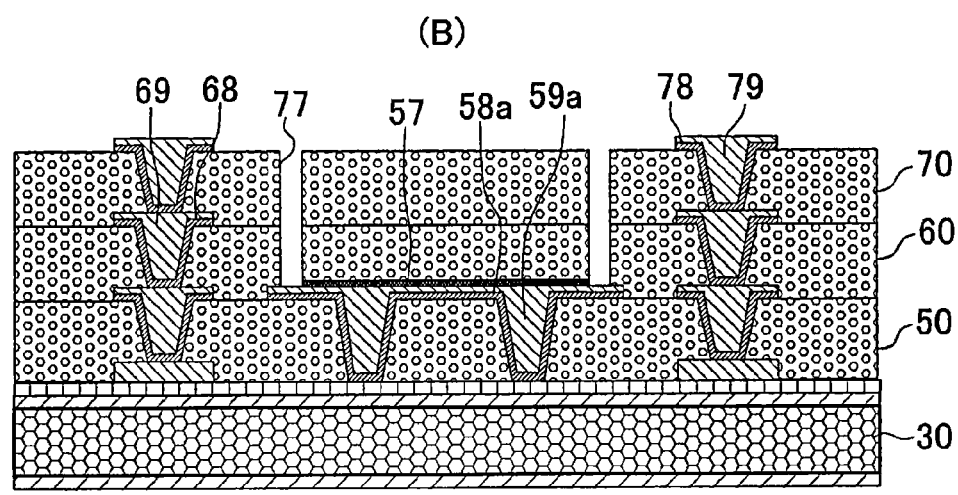
Figure 4:
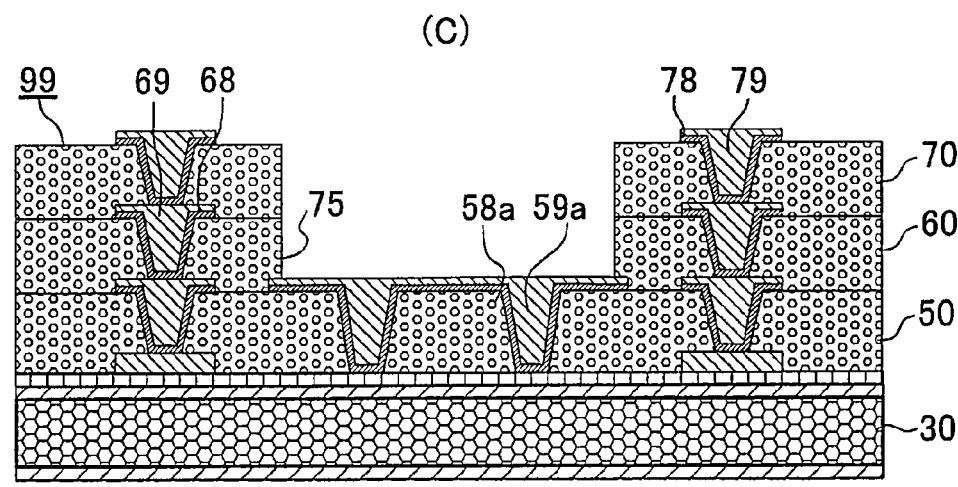
Figure 5:
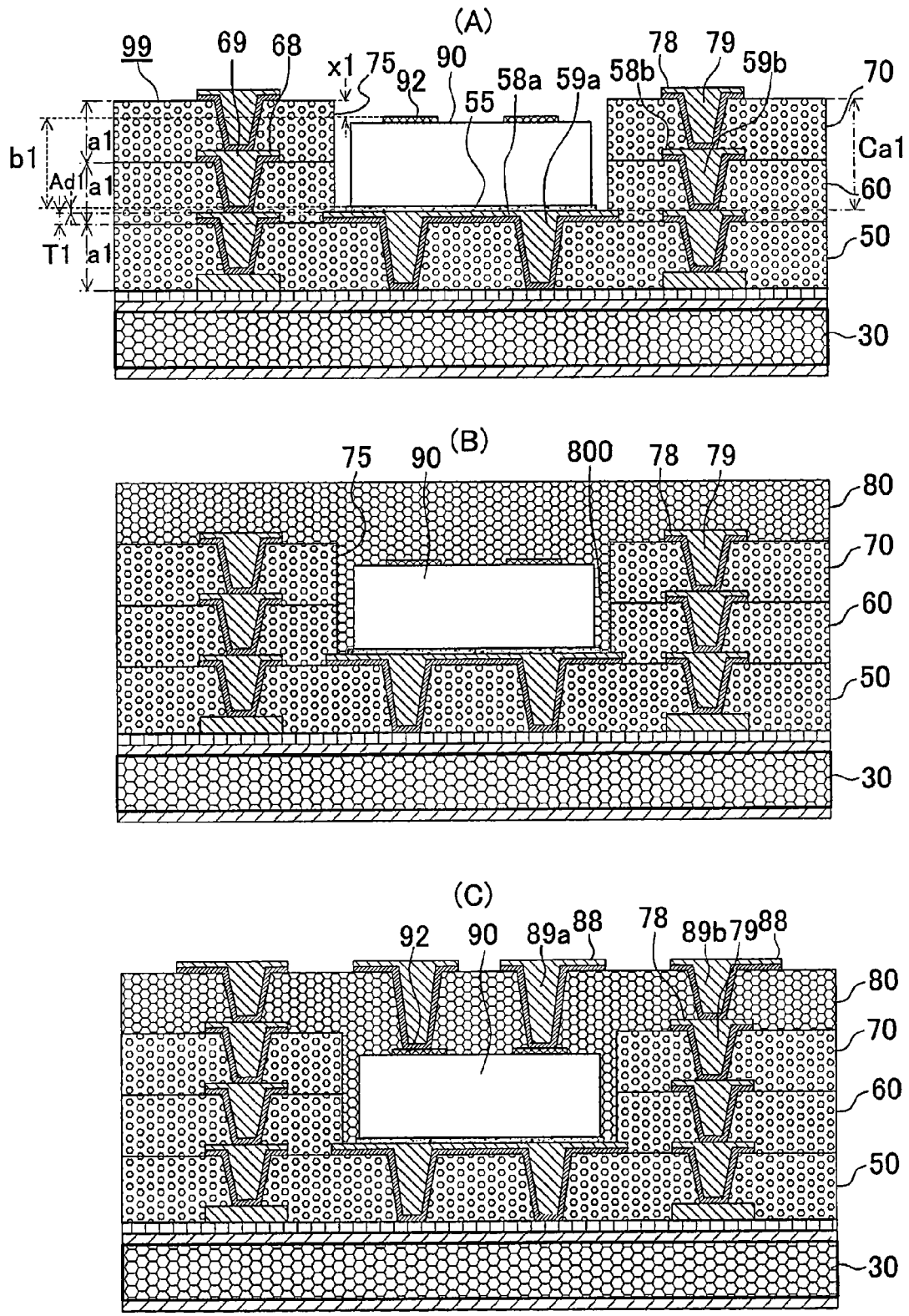
FIGS. 5(A)-5(C) are views of steps for manufacturing a printed wiring board according to the first embodiment.
Figure 6:
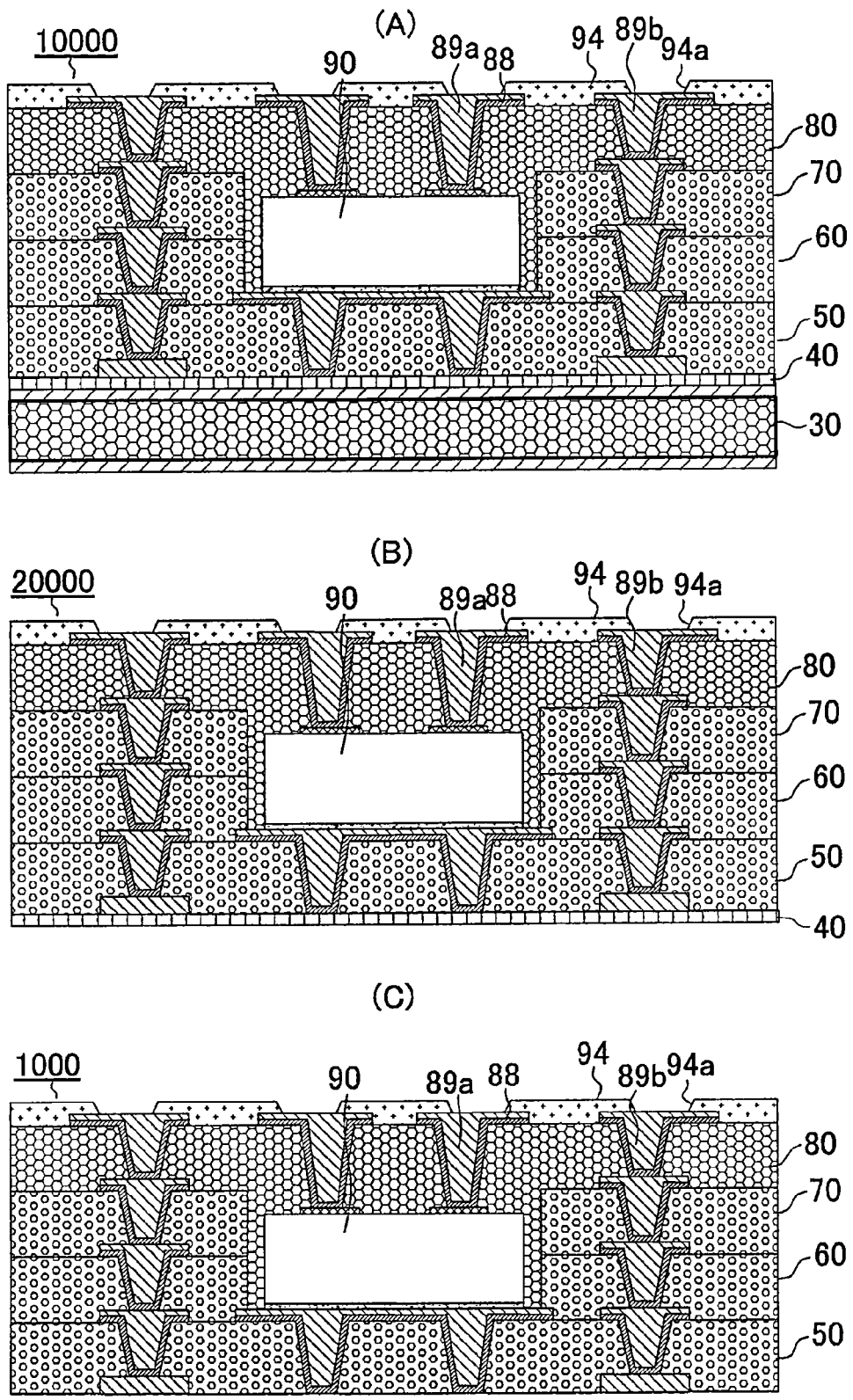
FIGS. 6(A)-6(C) are views of steps for manufacturing a printed wiring board according to the first embodiment.

Using the same method described with reference to FIGS. 2(A)~3(B), second resin insulation layer 60, second conductive layer 68 and second via conductor 69 are formed (FIG. 3(D)). Using the same process, third resin insulation layer 70, third conductive layer 78 and third via conductor 79 are formed (FIG. 4(A)). The second conductive layer and the third conductive layer are related to the bench mark of the first conductive layer. The third conductive layer includes a third bench mark, and the bench mark of the first conductive layer and the third bench mark are related. The second resin insulation layer and the third resin insulation layer each have a first surface and a second surface opposite the first surface. The second surface of the second resin insulation layer faces the first surface of the first resin insulation layer, and the second surface of the third resin insulation layer faces the first surface of the second resin insulation layer. Second conductive layer 68 is formed on the first surface of the second resin insulation layer. The first conductive layer and the second conductive layer are connected by second via conductor 69 formed in the second resin insulation layer. Third conductive layer 78 is formed on the first surface of the third resin insulation layer. The second conductive layer and the third conductive layer are connected by third via conductor 79 formed in the third resin insulation layer.

Figure 9:
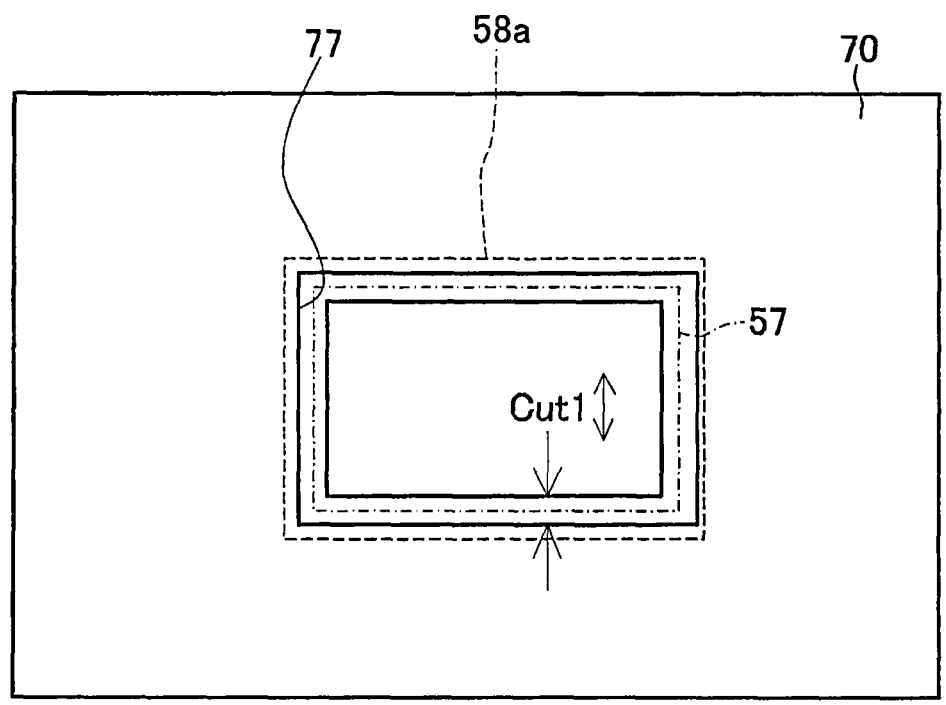
FIG. 9 is a plan view of a cut.

Cut 77 reaching the mounting conductive layer is formed in third resin insulation layer 70 and second resin insulation layer 60 using a laser (FIG. 4(B)). FIG. 9 shows a plan view of cut 77. The cut has a predetermined width (cut 1). It is preferred that cut 77 overlap the periphery of removable layer 57. The resin insulation layers on the removable layer are removed without leaving any removable layer residue. If the cut is formed inside the periphery of the removable layer, the removable layer tends to remain between the resin insulation layers and the mounting conductive layer. If the removable layer remains in the printed wiring board, peeling of insulation layers may occur. Since the cut is formed based on the third bench mark, the position of the cut is aligned with the position of the removable layer and the position of the mounting conductive layer. Accordingly, in the present embodiment, the removable layer is removed without leaving any residue.

When metal foil is used for the removable layer, the metal foil has a first surface and a second surface opposite the first surface, and the first surface is preferred to be flat and the second surface to be roughened. In such a case, it is preferred that the first surface face the mounting conductive layer and the second surface face the second insulation layer. The removable layer is adhered to the second resin insulation layer via the roughened surface. When the second resin insulation layer is removed, the removable layer is simultaneously removed.

Since removable layer 57 is not adhered to the mounting conductive layer, the resin insulation layers on the removable layer are removed from the mounting conductive layer using the removable layer. An opening is formed in the resin insulation layers to penetrate through the resin insulation layers and expose the mounting conductive layer. In the first embodiment, the second and third resin insulation layers are partially removed so that opening 75 is formed to penetrate through the second and third resin insulation layers. Intermediate substrate 99 having opening (cavity) 75 in the center is completed (FIG. 4(C)).

Adhesive layer (die attachment) 55 made of silver paste is formed on mounting conductive layer (58*a*). Electronic component 90 such as an IC chip is mounted on die attachment 55 (FIG. 5(A)). In the first embodiment, an electronic component is mounted on the intermediate substrate. Since the intermediate substrate has an opening, its strength is reduced. Also, since the intermediate substrate has an opening in its partial portion, warping tends to occur. However, according to the manufacturing method of the embodiment, the intermediate substrate has a support board when an electronic component is mounted on the intermediate substrate. Accordingly, the intermediate substrate has high strength. The degree of warping of the intermediate substrate is small. The surface exposed through the opening tends to be flat. In the first embodiment, the surface of the mounting conductive layer exposed through the opening is flat. Accordingly, in the present embodiment, it is easy to mount an electronic component on the intermediate substrate. Also, the electronic component is mounted in a predetermined location. Therefore, positional accuracy is high between an electrode of the electronic component and a via conductor (connection via conductor) connected to the electrode. Connection reliability is enhanced between the electrode of the electronic component and the via conductor directly connected to the electrode. Since the intermediate substrate is flat, bonding strength is enhanced between the electronic component and the intermediate substrate. Accordingly, the electronic component is seldom removed from the intermediate substrate during the process subsequent to the mounting.

A B-stage insulation layer is laminated on the first surface of the third resin insulation layer. Such an insulation layer covers electronic component 90. Then, intermediate substrate 99 and the insulation layer are thermal pressed. The resin of the insulation layer enters the opening to fill the opening. The insulation layer is cured, and interlayer resin insulation layer 80 is formed on the first surface of the third resin insulation layer and the electronic component. Also, the resin filled in the opening is cured to form filler resin 800 in the opening (FIG. 5(B)). When the insulation layer contains resin and inorganic particles, the filler resin contains resin and inorganic particles. Each resin insulation layer and the interlayer resin insulation layer contain inorganic particles such as glass as well as resin. Each resin insulation layer and the interlayer resin insulation layer may further include core material such as glass cloth.

Regarding interlayer resin insulation layer 80, conductive layer 88, via conductor (89*b*) and connection via conductor (89*a*) are formed using the same method described with reference to FIGS. 2(B)~3(B) (FIG. 5(C)). According to the manufacturing method of the first embodiment, an opening for a connection via conductor formed in the interlayer resin insulation layer is securely formed on an electrode of the electronic component.

Solder-resist layer 94 with opening (94*a*) is formed on interlayer resin insulation layer 80 (FIG. 6(A)). Laminated substrate 10000 is completed. The laminated substrate is cut inside the bonded area of the copper foil and the copper-clad laminate. Double-sided copper-clad laminate 30 is removed. Intermediate substrate 20000 is completed (FIG. 6(B)). Copper foil 40 is etched away from intermediate substrate 20000 (FIG. 6(C)). The second surface of an electrode, the heat-dissipating via conductor and the second surface of the first resin insulation layer are exposed. Printed wiring board 1000 is completed. The heat-dissipating via conductor does not have a pad on the second surface of the first resin insulation layer.

The manufacturing process for a printed wiring board includes a heating process and a pressurizing process. According to a method for manufacturing a printed wiring board of the first embodiment, an electronic component is built into a printed wiring board midway through the manufacturing process. Therefore, according to the manufacturing method of the first embodiment, the number of heating and pressurizing processes performed on the built-in electronic component is low compared with the processes in which an electronic component is built into a printed wiring board in the initial stage of the manufacturing process. Accordingly, the electronic component is less likely to be damaged by the heat and pressure. Also, stress exerted on an electrode of the electronic component and a via conductor connected to the electrode, as well as stress exerted on the interface between the electronic component and filler resin, is reduced. Therefore, connection reliability is enhanced between the electronic component and the printed wiring board. Cracking originating at a peeling of the interface between the electronic component and the filler resin is reduced in the printed wiring board.

A metal layer is formed on second surfaces of the conductive layer and electrode 42 exposed through openings (94*a*) of solder-resist layer 94. Such a metal layer is made of Sn film or Ni/Au film. Solder bump (96U) is formed on the conductive layer exposed through opening (94*a*) in solder-resist layer 94. Solder bump (96D) is formed on the second surface of electrode 42 (FIG. 7). Package substrate 100 is mounted on the printed wiring board via solder bump (96D). Multilayer printed wiring board 10 is mounted on motherboard 200 via solder bump (96U) (FIG. 8).

According to the manufacturing method of the first embodiment, the number of resin insulation layers to be removed is determined by the thickness of an electronic component to be built into the printed wiring board. The number of resin insulation layers to be removed may be one or more. Accordingly, in the first embodiment, thickness (a1) of each resin insulation layer (first resin insulation layer 50, second resin insulation layer 60, third resin insulation layer 70) is substantially the same as shown in FIG. 5(A). The thickness of the interlayer resin insulation layer is preferred to be the same as the thickness of a resin insulation layer. The cost of resin insulation layers is reduced. Also, if the thickness of each resin insulation layer is the same, the length of the via conductor and the thickness of the conductive layer on a resin insulation layer become substantially the same at each layer. Accordingly, since stress is dispersed substantially uniformly to the conductive layer and the via conductor of each layer, the printed wiring board in the first embodiment is seldom damaged by stress. In the first embodiment, two resin insulation layers are removed. In the first embodiment, depth (Ca 1) of cavity 75 is equal to the difference between the sum (2 a1) of the thicknesses of second resin insulation layer 60 and third resin insulation layer 70 and thickness (T1) of the mounting conductive layer, and is thicker than thickness (b1) of electronic component 90. Namely, the top surface of IC chip 90 is at a recessed position (lower position) from the first surface of third resin insulation layer 70 by (x1), and the recessed amount (x1) is half or less than half the thickness (a1) of a resin insulation layer. Here, since the electronic component is formed on adhesive layer 55, (x1) is shown as the following formula.

$x1=2a1-T1-Ad1-b1$ (*) (Ad 1) is the thickness of the adhesive layer (die attachment)

When cavity 75 is formed in n-layer resin insulation layers, (x1) is shown as the following formula.

$x1=n \times a1-T1-Ad1-b1$

As shown in FIG. 5(C), the length of connection via conductor (89*a*) is greater than that of fourth via conductor (89*b*). Since the thermal expansion coefficient of an electronic component such as an IC chip is smaller than that of other materials used in a printed wiring board in the first embodiment, stress exerted on an electrode of an IC chip and connection via conductor (89*a*) is usually greater than stress exerted on third conductive layer 78 and fourth via conductor (89*b*). However, since the length of connection via conductor (89*a*) is greater than that of fourth via conductor (89*b*), connection via conductor (89*a*) mitigates stress between the electrode of the IC chip and connection via conductor (89*a*). Accordingly, connection reliability is enhanced between the electronic component and the printed wiring board.

In the first embodiment, the depth is great in an opening for forming connection via conductor (89*a*) which reaches an electrode of an electronic component such as an IC chip. If the depth is great, to fill the opening, the thickness of conductive layer 88 becomes greater. To form a fine conductive layer on interlayer resin insulation layer 80, recessed amount (x1) is set to be half or less than half the thickness (a1) of a resin insulation layer. If (x1) increases, the diameter is required to be increased in the opening for connection via conductor (89*a*) on an electrode of the electronic component. From such a viewpoint, recessed amount (x1) is set to be half or less than half the thickness (a1) of a resin insulation layer.

The thickness of each resin insulation layer is preferred to be less than the thickness of the electronic component. Each conductive layer formed on each resin insulation layer is formed at the same time as a via conductor. If each resin insulation layer is thin, since the thickness of each conductive layer is thin, a fine conductive circuit is formed on each resin insulation layer.

In the first embodiment, resin insulation layer 50 that does not include an opening into which an electronic component is built, as well as interlayer resin insulation layer 80 that does not include an opening into which the electronic component is built, is formed on the upper and lower sides of the electronic component. Since the number of resin insulation layers is the same on the upper and lower sides of the electronic component, warping of the printed wiring board is suppressed.

Second Embodiment

Figure 11:
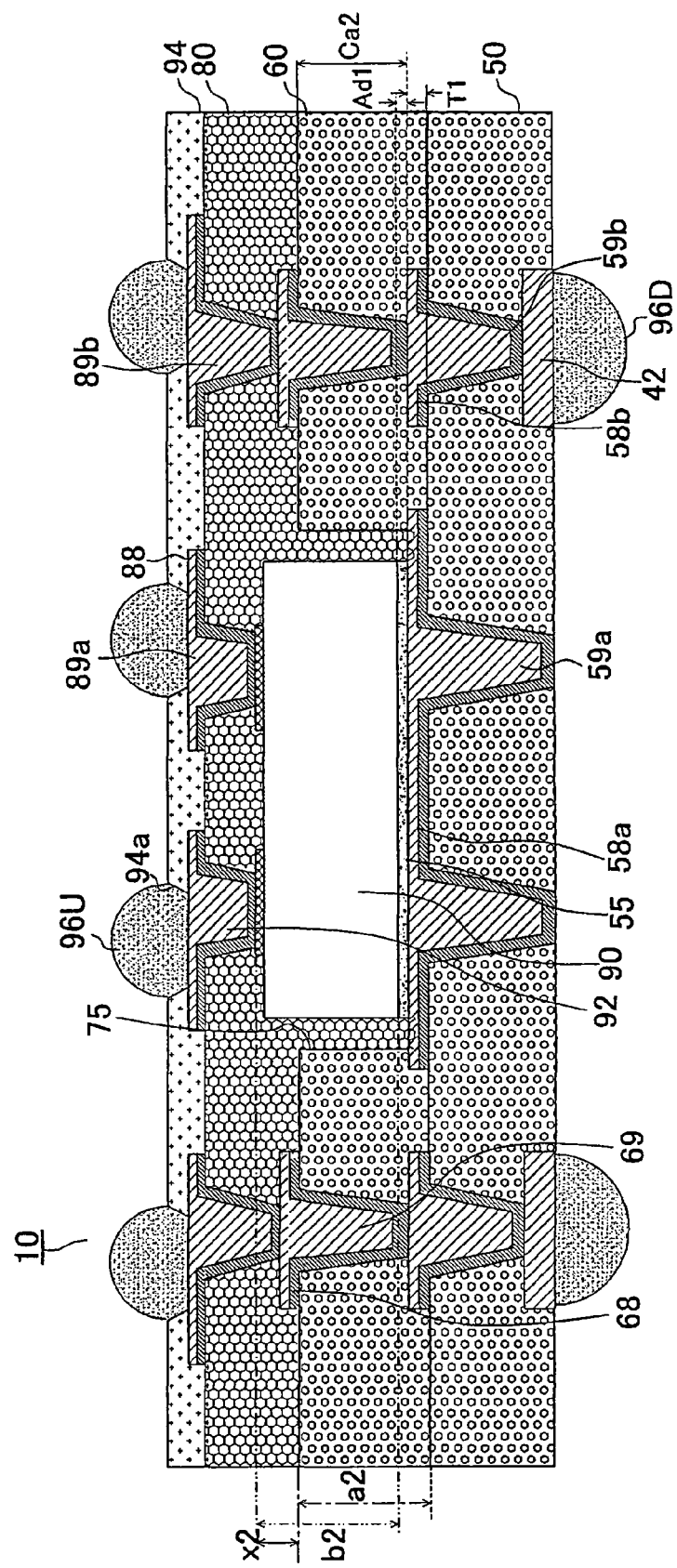
FIG. 11 is a cross-sectional view of a printed wiring board according to the second embodiment.

FIG. 11 shows a printed wiring board according to the second embodiment. In the second embodiment, cavity 75 is formed in second resin insulation layer 60, and an IC chip is accommodated therein. An opening into which an electronic component is built is formed only in a resin insulation layer.

Figure 10:
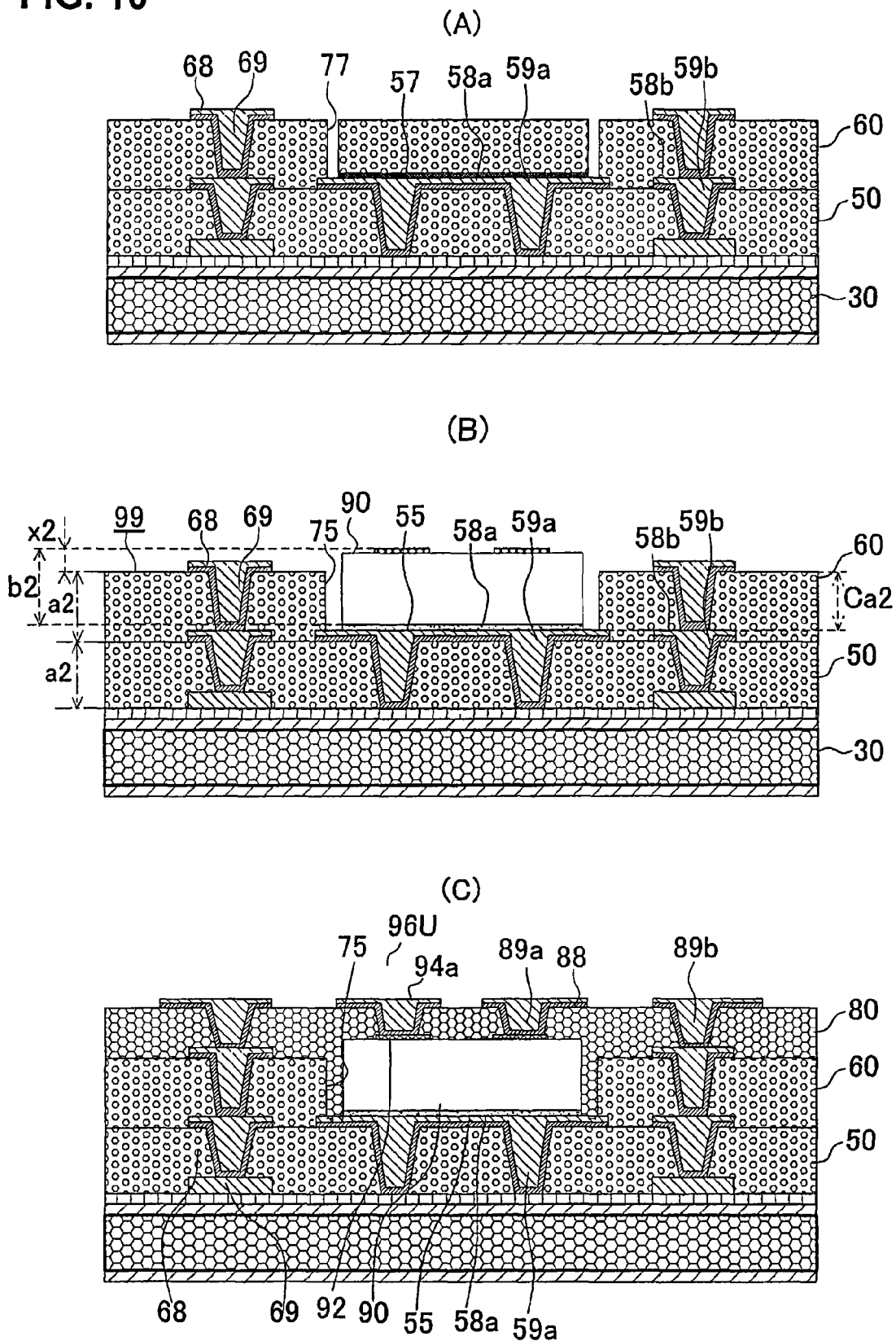
FIGS. 10(A)-10(C) are views of steps for manufacturing a printed wiring board according to the second embodiment.

A method for manufacturing a printed wiring board according to the second embodiment is described with reference to FIG. 10. A substrate shown in FIG. 3(D) is formed. The manufacturing method is the same method described by referring to FIGS. 1~3(D). Then, a cut is formed in the second resin insulation layer. The method and the position for forming the cut are the same as those in the first embodiment (FIG. 10(A)).

Second resin insulation layer 60 and removable layer 57 are removed along the cut, and the intermediate substrate having cavity 75 in its center is completed. IC chip 90 is mounted on mounting conductive layer (58*a*) via adhesive layer 55 (FIG. 10(B)). An insulation layer made of inorganic particles such as glass and B-stage epoxy resin is laminated on the first surface of the second resin insulation layer and on IC chip 90. Then, thermal pressing is conducted. Interlayer resin insulation layer 80 is formed on the first surface of the second resin insulation layer and on IC chip 90. Conductive layer 88 is formed on interlayer resin insulation layer 80 through the same process shown in FIG. 5(C). Also, via conductor (89*b*) and connection via conductor (89*a*) are formed in interlayer resin insulation layer 80 (FIG. 10(C)). The description of the subsequent process is omitted since it is the same as that in the first embodiment.

In the second embodiment, the cavity is formed in one layer of second resin insulation layer 60. Depth (Ca 2) of the cavity is shallower than thickness (b2) of electronic component 90 such as an IC chip. Protruding amount (x2) of IC chip 90 is half or less than half the thickness (a2) of second resin insulation layer 60. The following formula shows (x2).

$$x2 = b2 + T1 + Ad1 - a2$$

When the distance between the conductive layer on the interlayer resin insulation layer and an electrode of the electronic component is half or greater than half the resin insulation layer, short circuiting due to migration is prevented between the conductive layer on the interlayer resin insulation layer and the electrode of the electronic component. Also, when (x2) exceeds half the thickness of the resin insulation layer, connection reliability decreases between the conductive layer and the electrode due to the short length of the connection via conductor.

An opening for connection via conductor (89a) reaching electrode 92 of the IC chip is shallower than an opening for via conductor (89b). Therefore, the opening on electrode 92 of the IC chip and the opening for via conductor (89b) on the second conductive layer are formed under the same laser conditions. If the depth of the opening for connection via conductor (89a) is remarkably different from the depth of the opening for via conductor (89b), and if the opening for connection via conductor (89a) is deep, it is difficult to form them under the same conditions. That is because the size of the opening for connection via conductor (89a) on an electrode is reduced. Namely, the opening for a connection via conductor reaching an electrode and the opening for a via conductor reaching the second conductive layer have substantially the same opening diameter on the first surface of the interlayer resin insulation layer, but the size of the opening on the electrode is greater than the size of the opening on the second conductive layer. Thus, the connection area is great between connection via conductor (89a) and electrode 92, enhancing their connection reliability. Also, since the opening for via conductor (89b) and the opening for connection via conductor (89a) are formed under the same conditions, production efficiency is enhanced.

Third Embodiment

Figure 12:
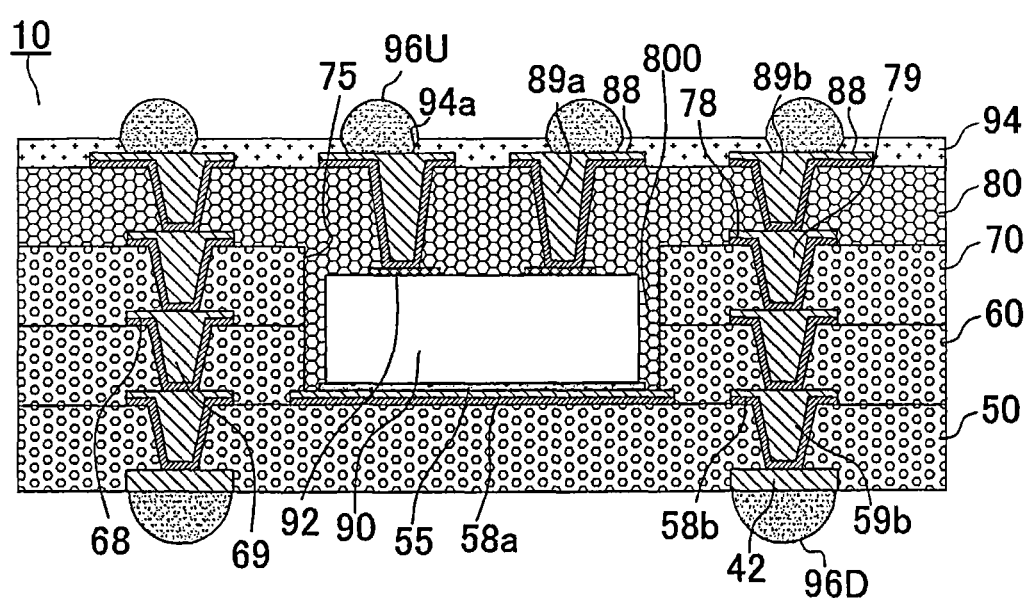
FIG. 12 is a cross-sectional view of a printed wiring board according to the third embodiment.

A printed wiring board according to the third embodiment is shown in FIG. 12. The printed wiring board of the third embodiment is the same as the printed wiring board according to the first embodiment except that it does not include a heat-dissipating via conductor. The printed wiring board according to the third embodiment is manufactured by the same method as in the first embodiment. By omitting the process for forming an opening for a heat-dissipating via conductor in the first embodiment, a printed wiring board according to the third embodiment is manufactured.

Fourth Embodiment

Figure 13:
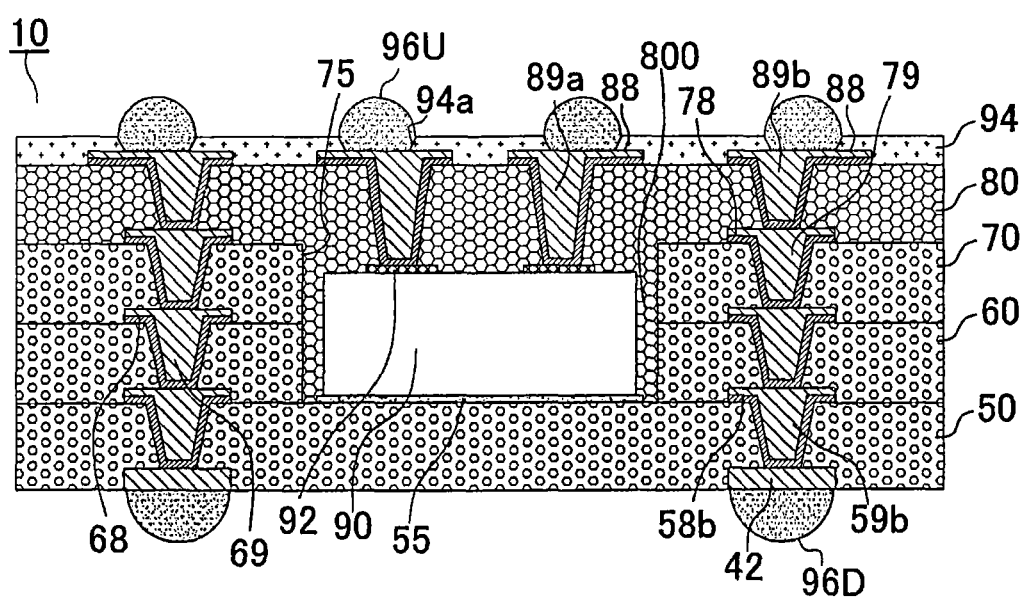
FIG. 13 is a cross-sectional view of a printed wiring board according to the fourth embodiment.

A printed wiring board according to the fourth embodiment is shown in FIG. 13. The printed wiring board of the fourth embodiment is the same as the printed wiring board of the first embodiment except that it does not include a mounting conductive layer and a heat-dissipating via conductor. A die attachment is formed directly on the first surface of the first resin insulation layer. The printed wiring board according to the fourth embodiment is manufactured by the same method as in the first embodiment. By omitting the process for forming a mounting conductive layer and a heat-dissipating via conductor in the first embodiment, the printed wiring board according to the fourth embodiment is manufactured. The first surface of the first resin insulation layer exposed through the cavity is preferred not to be roughened.

Fifth Embodiment

Figure 14:
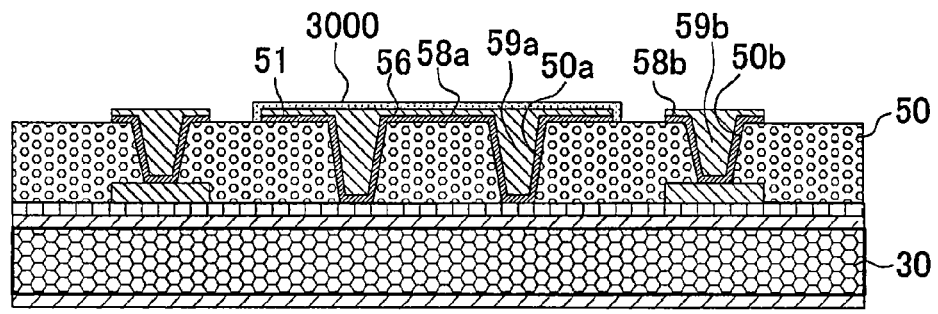
FIGS. 14(A)-14(C) are views of steps for manufacturing a printed wiring board according to the fifth embodiment.
Figure 14:
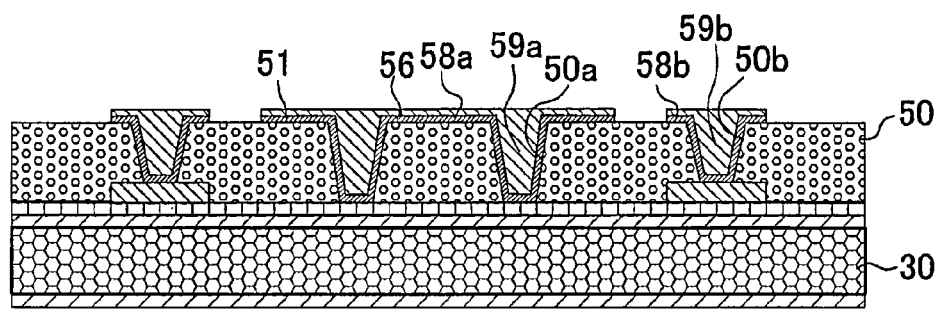
Figure 14:
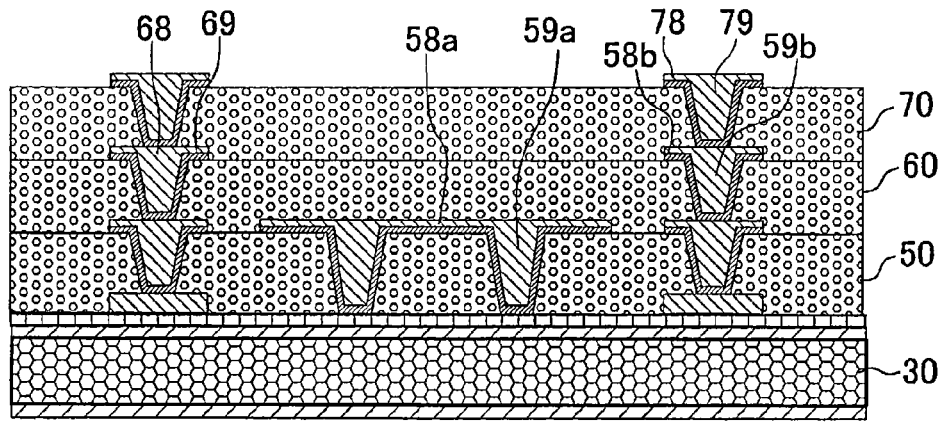

The following shows a manufacturing method according to the fifth embodiment. A substrate shown in FIG. 3(B) is formed by the same method as in the first embodiment. Then, the mounting conductive layer is covered with protective film 3000 (FIG. 14(A)). Next, the surfaces of a first conductive layer and a first via conductor are roughened. The roughened surfaces on the first conductive layer and the like are not shown in the drawings. The surface of the mounting conductive layer is not roughened. The protective film on the mounting conductive layer is removed (FIG. 14(B)). In the fifth embodiment, a removable layer is not laminated on the mounting conductive layer. A second resin insulation layer is formed on the first surface of the first resin insulation layer, the first conductive layer and the mounting conductive layer. The second resin insulation layer is formed directly on the mounting conductive layer. The same as in the first embodiment, the third resin insulation layer and the third conductive layer are formed (FIG. 14(C)). A cut reaching the mounting conductive layer is formed (FIG. 4(B)). The second and third resin insulation layers are partially removed. An opening (cavity) reaching the mounting conductive layer is formed (FIG. 4(C)). The process shown in FIGS. 5~7 in the first embodiment is performed on the substrate shown in FIG. 4(C).

In any embodiment, an electronic component is built into an intermediate substrate having a predetermined number of resin insulation layers. After the electronic component is built into the substrate, resin insulation layer(s) (including interlayer resin insulation layer(s)) having the same number of layer(s) as that of the resin insulation layer(s) without an opening are formed on the intermediate substrate. Thus, the electronic component is built into the substrate in the center in a cross-sectional direction. The embodiments of the present invention provide a printed wiring board in which warping is less likely to occur. The thickness of each resin insulation layer, resin layer and interlayer resin insulation layer used in each embodiment is 20 μm to 100 μm, and the thickness of the built-in electronic component is 30 μm to 150 μm.

Example 1

A 0.8 mm-thick double-sided copper-clad laminate and 5 μm-thick copper foil are prepared (FIG. 1(A)). The copper foil and the double-sided copper-clad laminate are bonded at their peripheries using ultrasound (FIG. 1(B)). The smooth surface of the copper foil faces the copper-clad laminate. Electrodes are formed on the copper foil (FIG. 1(C)). A first resin insulation layer is formed on the copper foil and the electrodes. The thickness of the first resin insulation layer is 50 μm (FIG. 2(A)). Openings reaching electrodes and the copper foil are formed (FIG. 2(B)). Using a well-known semi-additive method, a first conductive layer, first via conductors and a mounting conductive layer are formed (FIG. 3(B)). The first conductive layer includes an alignment mark. The external shape of the mounting conductive layer is larger than the external shape of an IC to be mounted. The surfaces of the first conductive layer, first via conductors and the mounting conductive layer are roughened. Based on the first alignment mark, a removable layer is formed on the mounting conductive layer (FIG. 3(C)). The removable layer is formed with copper foil, and its external shape is larger than the external shape of an IC to be mounted, but smaller than the external shape of the mounting conductive layer.

A second resin insulation layer is formed on the first resin insulation layer, the first conductive layer and the removable layer. The removable layer and the second resin insulation layer are adhered via the roughened surface of the copper foil. A second conductive layer is formed on the second resin insulation layer. Also, second via conductors are formed in the second resin insulation layer (FIG. 3(D)). The second conductive layer includes a second alignment mark. The first alignment mark and the second alignment mark are related.

A third resin insulation layer is formed on the second resin insulation layer and the second conductive layer. A third conductive layer is formed on the third resin insulation layer. Also, third via conductors are formed in the third resin insulation layer (FIG. 4(A)). The third conductive layer includes a third alignment mark. The first alignment mark and the third alignment mark are related (FIG. 4(A)). The thickness of the second and third resin insulation layers is 50 μm.

A cut is formed in the second and third resin insulation layers based on the third alignment mark (FIG. 4(B)). Width (cut 1) of the cut is 50 μm, and the periphery of the removable layer is exposed by the cut (FIG. 9). The cut includes the periphery of the removable layer. The removable layer and the second and third resin insulation layers are partially removed from above the mounting conductive layer. A die attachment made of silver paste is applied on the mounting conductive layer. Then, an IC is mounted on the mounting conductive layer via the silver paste (FIG. 5(A)). At that time, the IC is mounted based on the third alignment mark. The thickness of the mounting conductive layer is 12 μm, the thickness of the die attachment (the thickness from the top surface of the mounting conductive layer to the bottom of the electronic component) is 15 μm, and thickness (b1) of the IC is 50 μm. Therefore, (x1) is 23 μm, and (a1)/2 is 25 μm. Next, prepreg containing glass cloth, glass particles and epoxy resin is laminated on the third resin insulation layer and on the electronic component. Then, thermal pressing is conducted. The IC is fixed to the intermediate substrate by the filler resin containing glass particles and epoxy resin. Also, interlayer resin insulation layer 80 is formed on the third resin insulation layer and the filler resin (FIG. 5(B)). Interlayer resin insulation layer 80 contains glass cloth, glass particles and epoxy resin. The thickness of interlayer resin insulation layer 80 is 50 μm. Then, openings reaching electrodes of the IC and the third conductive layer are formed in interlayer resin insulation layer 80. Next, using a well-known semi-additive method, conductive layer 88, via conductors (89b) and connection via conductors (89a) are formed (FIG. 5(C)). A solder-resist layer is formed on interlayer resin insulation layer 80. Laminated substrate 10000 is completed (FIG. 6(A)). Laminated substrate 10000 is cut inside the bonded portion of the copper-clad laminate and the copper foil, detaching the copper-clad laminate and the copper foil. Intermediate substrate 20000 is completed (FIG. 6(B)). The copper foil is etched away from the intermediate substrate. Electrodes and heat-dissipating vias are exposed (FIG. 6(C)). Multilayer printed wiring board 1000 is completed.

Example 2

A printed wiring board in the second example (FIG. 11) is formed by the same method as in the second embodiment. The thickness of each resin insulation layer, interlayer resin insulation layer and IC is 50 μm, the thickness of the mounting conductive layer is 12 μm, and the thickness of the die attachment is 10 μm. Thus, (x2) is 22 μm, which is the same as or less than (a2)/2.

A method for manufacturing a printed wiring board according to an embodiment of the present invention includes the following: preparing a support board; on the support board, forming a first resin insulation layer having a first surface and a second surface opposite the first surface in such a way that the second surface of the first resin insulation layer faces the support board; on the first surface of the first resin insulation layer, forming a second resin insulation layer having a first surface and a second surface opposite the first surface in such a way that the second surface of the second resin insulation layer faces the first surface of the first resin insulation layer; in the second resin insulation layer, forming an opening for mounting an electronic component having an electrode; accommodating the electronic component in the opening in such a way that the electrode of the electronic component faces the first surface of the second resin insulation layer; on the first surface of the second resin insulation layer and the electronic component, forming an interlayer resin insulation layer having a first surface and a second surface opposite the first surface in such a way that the second surface of the interlayer resin insulation layer faces the first surface of the second resin insulation layer; in the interlayer resin insulation layer, forming a via conductor to reach the electrode of the electronic component; and removing the support board from the first resin insulation layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a first resin insulation layer;
   a second resin insulation layer formed on the first insulation layer and having an opening portion;
   a second conductive layer formed on the second resin insulation layer;
   a mounting conductive layer formed on the first resin insulation layer in the opening portion of the second resin insulation layer such that the mounting conductive layer has a surface exposed by the opening portion;
   an electronic component positioned in the opening portion of the second resin insulation layer such that the electronic component is mounted on the surface of the mounting conductive layer;
   a filler resin structure formed on the electronic component and the second resin insulation layer, the filler resin structure comprising a resin material filling a space formed between the second resin insulation layer and the electronic component;
   a third conductive layer formed on the filler resin structure;
   a plurality of via conductors formed through the filler resin structure, the plurality of via conductors including a first via conductor connected to an electrode of the electronic component and a second via conductor connecting the third conductive layer formed on the filler resin structure and the second conductive layer formed on the second resin insulation layer; and
   a heat-dissipating via conductor formed in the first resin insulation layer such that the heat-dissipating via conductor is connected to the mounting conductive layer formed on the first resin insulation layer,
   wherein the heat-dissipating via conductor is a filled via comprising a plated material filling an opening formed through the first resin insulation layer, and the mounting conductive layer comprise a plated material same as the plated material of the heat-dissipating via conductor.

2. The printed wiring board according to claim 1, wherein the surface of the mounting conductive layer is a roughened surface.

3. The printed wiring board according to claim 1, further comprising:
a first conductive layer formed on the first resin insulation layer, wherein the mounting conductive layer has a thickness which is equal to a thickness of the first conductive layer.

4. The printed wiring board according to claim 1, wherein the surface of the mounting conductive layer has an area which is greater than an area of the opening portion of the second resin insulation layer.

5. The printed wiring board according to claim 1, wherein the heat-dissipating via conductor is formed in a plurality in the first resin insulation layer such that the plurality of heat-dissipating via conductors is connected to the mounting conductive layer formed on the first resin insulation layer.

6. The printed wiring board according to claim 1, wherein the heat-dissipating via conductor is formed through the first resin insulation layer such that the heat-dissipating via conductor has an end portion exposed on a surface of the first resin insulation layer on an opposite side with respect to the mounting conductive layer.

7. The printed wiring board according to claim 1, wherein the heat-dissipating via conductor is formed through the first resin insulation layer such that the heat-dissipating via conductor has a tapered form narrowing from the mounting conductive layer toward the surface of the first resin insulation layer on the opposite side with respect to the mounting conductive layer.

8. The printed wiring board according to claim 1, further comprising:
a first conductive layer formed on the first resin insulation layer.

9. The printed wiring board according to claim 1, further comprising:
a first conductive layer formed on the first resin insulation layer, wherein the first conductive layer has a bench mark portion positioned relative to the mounting conductive layer such that the opening portion of the first resin insulation layer is formed based on the bench mark portion to expose the surface of the mounting conductive layer.

10. The printed wiring board according to claim 1, further comprising:
a first conductive layer formed on the first resin insulation layer, and comprising a plated material same as the plated material of the mounting conductive layer and the heat-dissipating via conductor.

11. The printed wiring board according to claim 1, further comprising:
a first conductive layer formed on the first resin insulation layer, and comprising a plated material same as the plated material of the mounting conductive layer, wherein the mounting conductive layer and the first conductive layer are comprising an electroless plated film and an electrolytic plated film formed on the electroless plated film.

12. The printed wiring board according to claim 1, further comprising:
a first conductive layer formed on the first resin insulation layer, wherein the surface of the mounting conductive layer is a roughened surface, and the first conductive layer has a roughened surface.

13. The printed wiring board according to claim 1, wherein the filler resin structure comprises glass cloth, glass particles and epoxy resin.

14. The printed wiring board according to claim 1, further comprising:
a first conductive layer formed on the first resin insulation layer, and comprising a plated material same as the plated material of the mounting conductive layer, wherein the mounting conductive layer and the first conductive layer are comprising an electroless plated film and an electrolytic plated film formed on the electroless plated film, and the surface of the mounting conductive layer has an area which is greater than an area of the opening portion of the second resin insulation layer.

15. The printed wiring board according to claim 1, wherein the heat-dissipating via conductor is formed in a plurality through the first resin insulation layer such that the plurality of heat-dissipating via conductors is connected to the mounting conductive layer formed on the first resin insulation layer and each of the heat-dissipating via conductors has an end portion exposed on a surface of the first resin insulation layer on an opposite side with respect to the mounting conductive layer.

16. The printed wiring board according to claim 1, further comprising:
a first conductive layer formed on the first resin insulation layer; and
a via conductor formed through the first resin insulation layer such that the via conductor is connected to the first conductive layer.

17. The printed wiring board according to claim 1, further comprising:
a solder-resist layer formed on the filler resin structure.

18. The printed wiring board according to claim 6, wherein the heat-dissipating via conductor is formed through the first resin insulation layer such that the end portion of the heat-dissipating via conductor is formed flat with the surface of the first resin insulation layer.

19. The printed wiring board according to claim 14, wherein the heat-dissipating via conductor is formed in a plurality in the first resin insulation layer such that the plurality of heat-dissipating via conductors is connected to the mounting conductive layer formed on the first resin insulation layer.

20. The printed wiring board according to claim 16, further comprising:
a solder-resist layer formed on the filler resin structure.

* * * * *